United States Patent
Gellineau et al.

(10) Patent No.: US 11,955,391 B2
(45) Date of Patent: *Apr. 9, 2024

(54) PROCESS MONITORING OF DEEP STRUCTURES WITH X-RAY SCATTEROMETRY

(71) Applicant: KLA Corporation, Milpitas, CA (US)

(72) Inventors: Antonio Arion Gellineau, Santa Clara, CA (US); Thaddeus Gerard Dziura, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 256 days.

This patent is subject to a terminal disclaimer.

(21) Appl. No.: 17/468,436

(22) Filed: Sep. 7, 2021

(65) Prior Publication Data

US 2021/0407864 A1 Dec. 30, 2021

Related U.S. Application Data

(63) Continuation of application No. 16/894,480, filed on Jun. 5, 2020, now Pat. No. 11,145,559, which is a
(Continued)

(51) Int. Cl.
*H01L 21/66* (2006.01)
*G01N 23/20* (2018.01)
(Continued)

(52) U.S. Cl.
CPC ....... *H01L 22/20* (2013.01); *G01N 23/20083* (2013.01); *G03F 7/70525* (2013.01);
(Continued)

(58) Field of Classification Search
CPC ........... H01L 2251/568; H01L 27/3213; H01L 27/3258; H01L 27/3262
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |

(Continued)

FOREIGN PATENT DOCUMENTS

| CN | 102810492 A | 12/2012 |
| JP | 2007-285923 A | 11/2007 |

OTHER PUBLICATIONS

Lemaillet, Germer, Kline et al., "Intercomparison between optical and x-ray scatterometry measurements of FinFET structures" by Proc. SPIE, v.8681, p. 86810Q (2013).
(Continued)

*Primary Examiner* — Dale E Page
*Assistant Examiner* — Wilner Jean Baptiste
(74) *Attorney, Agent, or Firm* — Spano Law Group; Joseph S. Spano

(57) ABSTRACT

Methods and systems for estimating values of process parameters, structural parameters, or both, based on x-ray scatterometry measurements of high aspect ratio semiconductor structures are presented herein. X-ray scatterometry measurements are performed at one or more steps of a fabrication process flow. The measurements are performed quickly and with sufficient accuracy to enable yield improvement of an on-going semiconductor fabrication process flow. Process corrections are determined based on the measured values of parameters of interest and the corrections are communicated to the process tool to change one or more process control parameters of the process tool. In some examples, measurements are performed while the wafer is being processed to control the on-going fabrication process step. In some examples, X-ray scatterometry measurements are performed after a particular process step and process control parameters are updated for processing of future devices.

12 Claims, 10 Drawing Sheets

Related U.S. Application Data continuation of application No. 15/990,749, filed on May 28, 2018, now Pat. No. 10,727,142.

(60) Provisional application No. 62/572,566, filed on Oct. 16, 2017, provisional application No. 62/512,297, filed on May 30, 2017.

(51) Int. Cl.
  *G03F 7/00* (2006.01)
  *H01L 21/67* (2006.01)

(52) U.S. Cl.
  CPC .... *G03F 7/70616* (2013.01); *H01L 21/67253* (2013.01); *G01N 2223/6116* (2013.01); *H01L 22/12* (2013.01)

(56) References Cited

U.S. PATENT DOCUMENTS

| | | | |
|---|---|---|---|
| 6,023,338 A | 2/2000 | Bareket | |
| 6,429,943 B1 | 8/2002 | Opsal et al. | |
| 6,694,284 B1 | 2/2004 | Nikoonahad et al. | |
| 6,716,646 B1 | 4/2004 | Wright et al. | |
| 6,771,028 B1 * | 8/2004 | Winters | H10K 59/131 315/169.3 |
| 6,778,275 B2 | 8/2004 | Bowes | |
| 6,787,773 B1 | 9/2004 | Lee | |
| 6,812,045 B1 | 11/2004 | Nikoonahad et al. | |
| 6,879,051 B1 | 4/2005 | Singh et al. | |
| 6,992,764 B1 | 1/2006 | Yang et al. | |
| 7,080,330 B1 | 7/2006 | Choo et al. | |
| 7,242,477 B2 | 7/2007 | Mieher et al. | |
| 7,321,426 B1 | 1/2008 | Poslavsky et al. | |
| 7,406,153 B2 | 7/2008 | Berman | |
| 7,478,019 B2 | 1/2009 | Zangooie et al. | |
| 7,486,343 B2 * | 2/2009 | Hong | G02F 1/136213 349/139 |
| 7,626,702 B2 | 12/2009 | Ausschnitt et al. | |
| 7,656,528 B2 | 2/2010 | Abdulhalim et al. | |
| 7,826,071 B2 | 11/2010 | Shchegrov et al. | |
| 7,842,933 B2 | 11/2010 | Shur et al. | |
| 7,873,585 B2 | 1/2011 | Izikson | |
| 7,929,667 B1 | 4/2011 | Zhuang et al. | |
| 7,933,026 B2 | 4/2011 | Opsal et al. | |
| 8,068,662 B2 | 11/2011 | Zhang et al. | |
| 8,138,498 B2 | 3/2012 | Ghinovker | |
| 9,459,219 B2 | 10/2016 | Gautsch et al. | |
| 10,101,670 B2 | 10/2018 | Pandev et al. | |
| 10,727,142 B2 | 7/2020 | Gellineau et al. | |
| 11,145,559 B2 * | 10/2021 | Gellineau | G03F 7/70525 |
| 2003/0021465 A1 | 1/2003 | Adel et al. | |
| 2004/0078108 A1 | 4/2004 | Choo et al. | |
| 2004/0246476 A1 | 12/2004 | Bevis et al. | |
| 2007/0221842 A1 | 9/2007 | Morokuma et al. | |
| 2007/0239305 A1 | 10/2007 | Zhuang et al. | |
| 2009/0152463 A1 | 6/2009 | Toyoda et al. | |
| 2011/0266440 A1 | 11/2011 | Boughorbel et al. | |
| 2012/0292502 A1 | 11/2012 | Langer et al. | |
| 2013/0075366 A1 | 3/2013 | Hautala | |
| 2013/0208279 A1 | 8/2013 | Smith | |
| 2013/0304424 A1 | 11/2013 | Bakeman et al. | |
| 2014/0019097 A1 | 1/2014 | Bakeman et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2015/0110249 A1 | 4/2015 | Bakeman et al. | |
| 2015/0117610 A1 | 4/2015 | Veldman et al. | |
| 2015/0176985 A1 | 6/2015 | Shchegrov et al. | |
| 2015/0204664 A1 | 7/2015 | Bringoltz et al. | |
| 2015/0204802 A1 | 7/2015 | Pois et al. | |
| 2015/0300965 A1 | 10/2015 | Sezginer et al. | |
| 2016/0109230 A1 | 4/2016 | Pandev et al. | |
| 2016/0202193 A1 | 7/2016 | Hench et al. | |
| 2016/0320319 A1 | 11/2016 | Hench et al. | |
| 2017/0167862 A1 | 6/2017 | Dziura et al. | |
| 2018/0106735 A1 | 4/2018 | Gellineau et al. | |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).

* cited by examiner

PROCESS MONITORING OF DEEP STRUCTURES WITH X-RAY SCATTEROMETRY

CROSS REFERENCE TO RELATED APPLICATION

The present application for patent is a continuation of, and claims priority under 35 U.S.C. § 120 from, U.S. patent application Ser. No. 16/894,480, entitled "Process Monitoring Of Deep Structures With X-Ray Scatterometry," filed Jun. 5, 2020, which, in turn, is a continuation of, and claims priority under 35 U.S.C. § 120 from, U.S. patent application Ser. No. 15/990,749, entitled "Process Monitoring Of Deep Structures With X-Ray Scatterometry," filed May 28, 2018, which, in turn, claims priority under 35 U.S.C. § 119 from U.S. provisional patent application Ser. No. 62/512,297, entitled "Process Monitoring for Deep Structures Using X-Ray Scatterometry," filed May 30, 2017 and from U.S. provisional patent application Ser. No. 62/572,566, entitled "Process Monitoring for Deep Structures Using X-Ray Scatterometry," filed Oct. 16, 2017, the subject matter of each is incorporated herein by reference in its entirety.

TECHNICAL FIELD

The described embodiments relate to metrology systems and methods, and more particularly to methods and systems for improved measurement of semiconductor structures undergoing a fabrication process step.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures. X-ray scatterometry techniques offer the potential for high throughput without the risk of sample destruction.

Traditionally, optical scatterometry critical dimension (SCR) measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. Optical metrology tools utilizing infrared to visible light can penetrate many layers of translucent materials, but longer wavelengths that provide good depth of penetration do not provide sufficient sensitivity to small anomalies. In addition, the increasing number of parameters required to characterize complex structures (e.g., FinFETs), leads to increasing parameter correlation. As a result, the parameters characterizing the target often cannot be reliably decoupled with available measurements.

In one example, longer wavelengths (e.g. near infrared) have been employed in an attempt to overcome penetration issues for 3D FLASH devices that utilize polysilicon as one of the alternating materials in the stack. However, the mirror like structure of 3D FLASH intrinsically causes decreasing light intensity as the illumination propagates deeper into the film stack. This causes sensitivity loss and correlation issues at depth. In this scenario, optical SCD is only able to successfully extract a reduced set of metrology dimensions with high sensitivity and low correlation.

In another example, opaque, high-k materials are increasingly employed in modern semiconductor structures. Optical radiation is often unable to penetrate layers constructed of these materials. As a result, measurements with thin-film scatterometry tools such as ellipsometers or reflectometers are becoming increasingly challenging.

In response to these challenges, more complex optical metrology tools have been developed. For example, tools with multiple angles of illumination, shorter illumination wavelengths, broader ranges of illumination wavelengths, and more complete information acquisition from reflected signals (e.g., measuring multiple Mueller matrix elements in addition to the more conventional reflectivity or ellipsometric signals) have been developed. However, these approaches have not reliably overcome fundamental challenges associated with measurement of many advanced targets (e.g., complex 3D structures, structures smaller than 10 nm, structures employing opaque materials) and measurement applications (e.g., line edge roughness and line width roughness measurements).

Optical methods may provide non-destructive tracking of process variable between process steps, but regular calibration by destructive methods is required to maintain accuracy in the face of process drift, which optical methods cannot independently distinguish.

Atomic force microscopes (AFM) and scanning-tunneling microscopes (STM) are able to achieve atomic resolution, but they can only probe the surface of the specimen. In addition, AFM and STM microscopes require long scanning times. Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance. X-ray reflectometers also suffer from penetration issues that limit their effectiveness when measuring high aspect ratio structures.

To overcome penetration depth issues, traditional imaging techniques such as TEM, SEM etc., are employed with destructive sample preparation techniques such as focused ion beam (FIB) machining, ion milling, blanket or selective etching, etc. For example, transmission electron microscopes (TEM) achieve high resolution levels and are able to probe arbitrary depths, but TEM requires destructive sectioning of the specimen. Several iterations of material removal and measurement generally provide the information required to measure the critical metrology parameters throughout a three dimensional structure. But, these techniques require sample destruction and lengthy process times. The complexity and time to complete these types of measurements introduces large inaccuracies due to drift of etching and metrology steps because the measurement results become available long after the process has been completed on the wafer under measurement. Thus, the measurement results are subject to biases from further processing and delayed feedback. In addition, these techniques require numerous iterations which introduce registration errors. In summary, device yield is negatively impacted by long and destructive sample preparation required for SEM and TEM techniques.

In semiconductor device manufacturing, etch processes and deposition processes are critical steps to define a device pattern profile and layout on a semiconductor wafer. Thus, it is important to measure films and patterned structures to ensure the fidelity of the measured structures and their uniformity across the wafer. Furthermore, it is important to provide measurement results quickly to control the on-going process and to adjust settings to maintain required pattern or film uniformity across the wafer.

In most examples, precise monitoring of a semiconductor manufacturing process is performed by one or more stand-alone (SA) metrology systems. SA metrology systems usually provide the highest measurement performance. However, the wafer must be removed from the process tool for measurement. For processes undertaken in vacuum, this causes significant delay. As a result, SA metrology systems cannot provide fast measurement feedback to process tools, particularly process tools involving vacuum. In other examples, integrated metrology systems or sensors are often attached to process equipment to measure wafers after a process step is completed, but without removing the wafer from the process tool. In other examples, in-situ (IS) metrology systems or sensors are employed inside a processing chamber of a process tool. Furthermore, an IS metrology system monitors the wafer during the process (e.g., etch process, deposition process, etc.) and provides feedback to the process tool performing the fabrication step under measurement.

In one example, structures subject to a reactive ion etch process are monitored in-situ. In some fabrication steps, the etch process is required to etch completely through an exposed layer and then terminate before substantial etching of a lower layer occurs. Typically, these process steps are controlled by monitoring the spectral signature of the plasma present in the chamber using an emission spectroscopy technique. When the exposed layer is etched through and the etch process begins to react with a lower layer, a distinct change in the spectral signature of the plasma occurs. The change in spectral signature is measured by the emission spectroscopy technique, and the etch process is halted based on the measured change is spectral signature.

In other fabrication steps, the etch process is required to etch partially through an exposed layer to a specified etch depth, and terminate before etching completely through the exposed layer. This type of etch process is commonly referred to as a "blind etch". Currently, the measurement of etch depth through partially etched layers is based on near-normal incidence spectral reflectometry.

Current in-situ sensors are only capable of monitoring bulk changes to film thicknesses and do not correlate well to the complex profiles that result from the processing of deep 3-D structures.

In general, there are many methods of process monitoring using combinations of optical, acoustic and electron beam tools. These techniques measure the device directly, specially designed targets, or specific monitor wafers. However, the inability to measured parameters of interest of high aspect ratio structures in a cost effective and timely manner results in low yield, particularly in the memory sector of a wafer.

In summary, ongoing reductions in feature size and increased depth of many semiconductor structures imposes difficult requirements on metrology systems, including stand-alone systems and those integrated with process tools, such as ion implant and etch tools. Thus, improved metrology systems and methods are desired to measure high aspect ratio structures to maintain high device yield.

SUMMARY

Methods and systems for estimating values of process parameters, structural parameters, or both, based on x-ray scatterometry measurements of high aspect ratio semiconductor structures are presented herein. X-ray scatterometry measurements are performed at one or more steps of a fabrication process flow. Exemplary process steps include etch, deposition, and lithography processes. The measurements are performed quickly and with sufficient accuracy to enable yield improvement of an on-going semiconductor fabrication process flow. In some examples, measurements are performed while the wafer is being processed to control the on-going fabrication process.

In one aspect, a small-angle scatterometry (SAXS) metrology system is integrated with a wafer processing tool, and measured values of parameters of interest are provided as feedback to control the wafer processing tool. In some embodiments, a transmission SAXS measurement system is employed. In other embodiments, a reflective SAXS measurement system is employed.

In some embodiments, a SAXS metrology system is integrated with a wafer processing tool such as an etch, deposition, or lithography tool. In other embodiments, the SAXS metrology system is constructed as a stand-alone tool.

In a further aspect, a SAXS system estimates values of one or more parameters of interest (e.g., process parameter values, structural parameter values, or both) based on scatterometry measurements of wafers under process using a measurement model.

In another further aspect, process corrections are determined based on the measured values of the parameters of interest and the corrections are communicated to the process tool to change one or more process control parameters of the process tool. In some embodiments, SAXS measurements are performed and process control parameters are updated while the process is being executed on the measured structure. In some embodiments, SAXS measurements are performed after a particular process step and process control parameters associated with that process step are updated for processing of future devices by that process step. In some embodiments, SAXS measurements are performed after a particular process step and process control parameters associated with a subsequent process step are updated for processing of the measured device or other devices by the subsequent process step.

The measurement frequency of a particular high aspect ratio structure under fabrication depends on the stability of the monitored process parameter. Moreover, the length of measurement time required depends on the scattering sensitivity to changes in the monitored process variable. Measuring a scattering signal in-situ provides the fastest measurement of process conditions but with the highest degree of uncertainty. Whereas, longer measurement times provide greater precision and certainty of the measured parameters. In general, process parameters that affect the entire scattering volume (e.g., etch time) can be monitored the fastest, while other parameters (e.g., minor deviations of the etch profile) require either a moving average or longer measurement time to achieve meaningful results. Thus, these parameters can only be controlled on a slower basis.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for estimating values of process parameters, structural parameters, or both, based on x-ray scatterometry measurements of partially fabricated, high aspect ratio semiconductor structures are presented herein. X-ray scatterometry measurements of high aspect ratio structures are performed at one or more steps of a fabrication process flow. Exemplary process steps include etch, deposition, and lithography processes. The measurements are performed quickly and with sufficient accuracy to enable yield improvement of an on-going semiconductor fabrication process flow. In some examples, measurements performed while the wafer is being processed are used to control the on-going process. High aspect ratio structures include sufficient overall scattering volume and material contrast to efficiently scatter incident x-rays. The collected, scattered x-rays enable accurate estimation of structural parameters of interest of measured devices. The x-ray energy is high enough to penetrate the silicon wafer and process gases in the optical path with minimal signal contamination.

Device yield of advanced semiconductor manufacturing nodes continues to suffer, particularly the device yield of complex, high aspect ratio (deep, three-dimensional) structures. Real-time monitoring and process control based on x-ray scatterometry enables process control for the fabrication of high aspect ratio structures in a cost effective manner compared to traditional destructive techniques such as SEM, TEM, etc.

X-ray scatterometry measurements provide accurate estimates of structural parameters of interest of high aspect ratio structures at high throughput without destroying the sample under measurement. Measurement sensitivity is not significantly affected by penetration depth, enabling accurate measurement of structures located deep within the vertical stack of the measured semiconductor structure. Moreover, x-ray radiation propagating through a plasma processing environment is relatively insensitive to signal contamination from electromagnetic fields generated by the plasma process compared to optical radiation.

In one aspect, a small-angle scatterometry (SAXS) metrology system is integrated with a wafer processing tool, and measured values of parameters of interest are provided as feedback to control the wafer processing tool.

Figure 1:
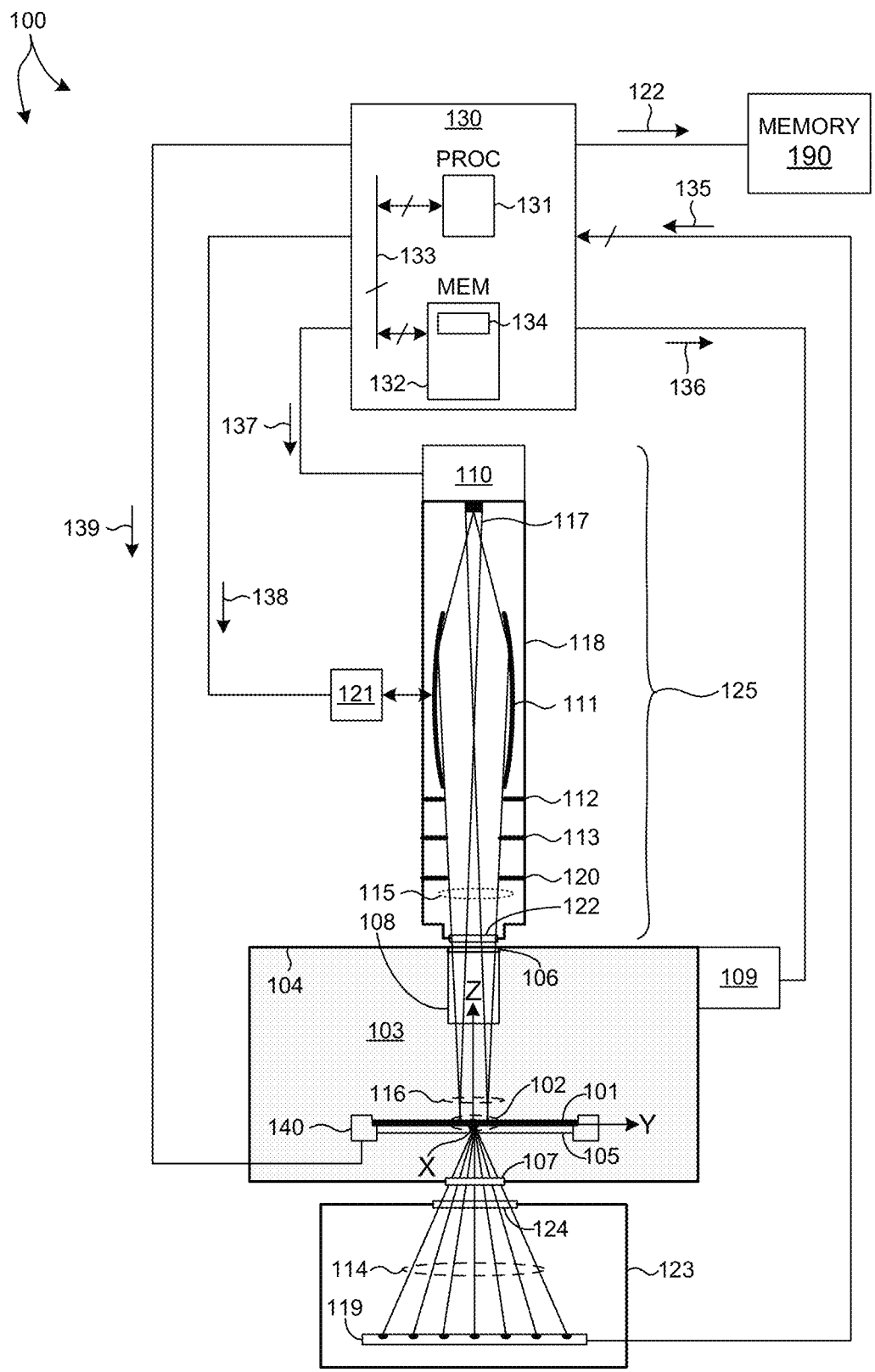
FIG. 1 depicts an exemplary wafer processing system 100 for monitoring of an etch process based on x-ray scatterometry measurements of semiconductor structures disposed on a wafer under process.

FIG. 1 depicts an exemplary wafer processing system 100 for monitoring of an etch process based on x-ray scatterometry measurements of semiconductor structures disposed on a wafer under process. In the depicted embodiment, a transmission, small-angle scatterometry (T-SAXS) metrology system is integrated with an etch process tool. The measured values of the parameters of interest are provided as feedback to control the etch process tool.

Wafer processing system 100 includes a process chamber 104 containing a process environment 103 and an x-ray scatterometer. Semiconductor wafer 101 is located within process chamber 104. Wafer 101 is attached to wafer chuck 105 and is positioned with respect to process chamber 104 and the x-ray scatterometer by wafer stage 140.

In some embodiments, wafer stage 140 moves wafer 101 in the XY plane by combining a rotational movement with a translational movement (e.g., a translational movement in the X direction and a rotational movement about the Y-axis) to position wafer 101 with respect to the illumination provided by the x-ray scatterometer. In some other embodiments, wafer stage 140 combines two orthogonal, translational movements (e.g., movements in the X and Y directions) to position wafer 101 with respect to the illumination provided by the x-ray scatterometer. In some embodiments, wafer stage 140 is configured to control the position of wafer 101 with respect to the illumination provided by the x-ray scatterometer in six degrees of freedom. In general, specimen positioning system 140 may include any suitable combination of mechanical elements to achieve the desired linear and angular positioning performance, including, but not limited to goniometer stages, hexapod stages, angular stages, and linear stages.

In some embodiments, wafer processing system 100 does not include wafer stage 140. In these embodiments, a wafer handling robot (not shown) locates wafer 101 on wafer chuck 105 inside process chamber 104. Wafer 101 is transferred from the wafer handling robot onto an electrostatic wafer chuck 105 that is compatible with a vacuum process environment 103. In these embodiments, the measurements performed by the x-ray scatterometer are limited to the portion of wafer 101 within the field of view of the x-ray scatterometer after clamping of wafer 101 onto wafer chuck 105. In this sense, wafer stage 140 is optional. To overcome this limitation, wafer processing system 100 may include multiple x-ray scatterometer systems, each measuring a different area of wafer 101.

In one embodiment, process chamber 104 is an element of a reactive ion etch system. In this embodiment, process environment 103 includes a radio frequency induced plasma that etches away exposed material on the surface of wafer 101.

As depicted in FIG. 1, the optical elements of the x-ray scatterometer are located outside of the process chamber 104. Ionized particles are present in the process chamber of both etch and deposition processes. Optical elements must be located sufficiently far away from the wafer to avoid disturbing the magnetic fields induced by the process. In addition, ionized particles may accumulate on optical elements located in the process chamber, and thus it is not practical to include the optical elements in the process chamber.

In the depicted embodiment, the SAXS metrology system includes an x-ray illumination subsystem 125 including an x-ray illumination source 110, focusing optics 111, beam divergence control slit 112, intermediate slit 113, and a beam shaping slit mechanism 120. The x-ray illumination source 110 is configured to generate x-ray radiation suitable for T-SAXS measurements. In some embodiments, the x-ray illumination source 110 is configured to generate wavelengths between 0.01 nanometers and 1 nanometer. In general, any suitable high-brightness x-ray illumination source capable of generating high brightness x-rays at flux levels sufficient to enable high-throughput, inline metrology may be contemplated to supply x-ray illumination for T-SAXS measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV, or greater than 17 keV, are employed to ensure that the x-ray source supplies light at wavelengths that allow sufficient transmission through the entire device as well as the wafer substrate, and any intervening elements. Intervening elements may include one or more windows (e.g., windows made from beryllium, sapphire, diamond, etc.). Intervening elements may also include structures in the path of the scattered x-ray radiation between the wafer 101 and detector 119, such as wafer chuck 105, a load port, or elements of stage 140. Transmission through structural plastic materials does not risk excessive contamination of the scattered signals. Apertures or windows through structural elements of wafer chuck 105, stage 140, or a load port may be employed to minimize signal contamination. For example, the x-ray spot at the wafer may be as small as 50-200 micrometers. For elements located close to the wafer, the size of the aperture required to minimize contamination of the scattered orders is minimal. However, the required aperture size increases as the distance from the wafer increases due to the finite scattering angles associated with the scattered orders of interest.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

By way of non-limiting example, x-ray illumination source 110 may include any of a particle accelerator source, a liquid anode source, a rotating anode source, a stationary, solid anode source, a microfocus source, a microfocus rotating anode source, a plasma based source, and an inverse Compton source. In one example, an inverse Compton source available from Lyncean Technologies, Inc., Palo Alto, California (USA) may be contemplated. Inverse Compton sources have an additional advantage of being able to produce x-rays over a range of photon energies, thereby enabling the x-ray source to deliver x-ray radiation at different, selectable wavelengths.

In some examples, computing system 130 communicates command signals 137 to x-ray illumination source 110 that cause x-ray illumination source 110 to emit x-ray radiation at a desired energy level. The energy level is changed to acquire measurement data with more information about the high aspect ratio structures under measurement.

X-ray illumination source 110 produces x-ray emission over a source area having finite lateral dimensions (i.e., non-zero dimensions orthogonal to the beam axis. Focusing optics 111 focuses source radiation onto a metrology target located on specimen 101. The finite lateral source dimension results in finite spot size 102 on the target defined by the rays 117 coming from the edges of the source. In some embodiments, focusing optics 111 includes elliptically shaped focusing optical elements.

A beam divergence control slit 112 is located in the beam path between focusing optics 111 and beam shaping slit mechanism 120. Beam divergence control slit 112 limits the divergence of the illumination provided to the specimen under measurement. An additional intermediate slit 113 is located in the beam path between beam divergence control slit 112 and beam shaping slit mechanism 120. Intermediate slit 113 provides additional beam shaping. In general, however, intermediate slit 113 is optional.

Beam shaping slit mechanism 120 is located in the beam path before specimen 101. In some embodiments, beam shaping slit mechanism 120 includes multiple, independently actuated beam shaping slits. In one embodiment, beam shaping slit mechanism 120 includes four independently actuated beam shaping slits. These four beams shaping slits effectively block a portion of incoming beam 115 and generate an illumination beam 116 having a box shaped illumination cross-section.

In general, x-ray optics shape and direct x-ray radiation to specimen 101. In some examples, the x-ray optics include an x-ray monochromator to monochromatize the x-ray beam that is incident on the specimen 101. In some examples, the x-ray optics collimate or focus the x-ray beam onto measurement area 102 of specimen 101 to less than 1 milliradian divergence using multilayer x-ray optics. In these examples, the multilayer x-ray optics function as a beam monochromator, also. In some embodiments, the x-ray optics include one or more x-ray collimating mirrors, x-ray apertures, x-ray beam stops, refractive x-ray optics, diffractive optics such as zone plates, Montel optics, specular x-ray optics such as grazing incidence ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

In some embodiments, x-ray illumination source 110, focusing optics 111, slits 112 and 113, or any combination thereof, are maintained in a controlled atmospheric environment (e.g., gas purge environment). However, in some embodiments, the optical path length between and within any of these elements is long and x-ray scattering in air contributes noise to the image on the detector. Hence in some embodiments, any of x-ray illumination source 110, focusing optics 111, and slits 112 and 113 are maintained in a localized, vacuum environment. In the embodiment depicted in FIG. 1, focusing optics 111, slits 112 and 113, and beam shaping slit mechanism 120 are maintained in a controlled environment (e.g., vacuum) within an evacuated flight tube 118. The illumination beam 116 passes through window 122 at the end of flight tube 118 before incidence with window 106 of process chamber 104. In some embodiments, flight tube 118 is integrated with process chamber 104 with a window separating the process environment 103 from the vacuum environment maintained within flight tube 118.

After incidence with wafer 101, scattered x-ray radiation 114 exits process chamber 104 through window 107. In some embodiments, the optical path length between process chamber 104 and detector 119 (i.e., the collection beam path) is long and x-ray scattering in air contributes noise to the image on the detector. Hence, in preferred embodiments, a significant portion of the collection beam path length between process chamber 104 and detector 119 is maintained in a localized vacuum environment separated from the environment by a vacuum window (e.g., vacuum window 124). In some embodiments, vacuum chamber 123 is integrated with process chamber 104 with a window separating the process environment 103 from the vacuum environment maintained within vacuum chamber 123. In some embodiments, x-ray detector 119 is maintained in the same localized vacuum environment as the beam path length between process chamber 104 and detector 119. For example, as depicted in FIG. 1, vacuum chamber 123 maintains a localized vacuum environment surrounding detector 119 and a significant portion of the beam path length between process chamber 104 and detector 119.

In some other embodiments, x-ray detector 119 is maintained in a controlled atmospheric environment (e.g., gas purge environment). This may be advantageous to remove heat from detector 119. However, in these embodiments, it is preferable to maintain a significant portion of the beam path length between process chamber 104 and detector 119 in a localized vacuum environment within a vacuum chamber. In general, the vacuum windows may be constructed of any suitable material that is substantially transparent to x-ray radiation (e.g., Kapton, Beryllium, etc.).

In the embodiment depicted in FIG. 1, illumination light passes through one or more window elements 106 of gas injector system 108 of process chamber 104. Gas injector system 108 extends from window element 106 into process chamber 104. In one embodiment, the distance from window element 106 and wafer 101 is approximately 300 millimeters and gas injector system 108 extends approximately 150 millimeters from window elements 106 toward wafer 101. Gas injector system 108 introduces a gas flow along the x-ray illumination path to prevent ionized gas particles from impacting and contaminating window elements 106. Exemplary gas injector systems are manufactured by LAM Research Corporation, Fremont, California (USA).

X-ray detector 119 collects x-ray radiation 114 scattered from specimen 101 and generates an output signals 135 indicative of properties of specimen 101 that are sensitive to the incident x-ray radiation in accordance with a T-SAXS measurement modality. In some embodiments, scattered x-rays 114 are collected by x-ray detector 119 while specimen positioning system 140 locates and orients specimen 101 to produce angularly resolved scattered x-rays.

In some embodiments, a T-SAXS system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage (e.g., in memory 190).

In a further aspect, a T-SAXS system is employed to determine properties of a specimen (e.g., structural parameter values) based on one or more diffraction orders of scattered light. As depicted in FIG. 1, system 100 includes a computing system 130 employed to acquire signals 135 generated by detector 119 and determine properties of the specimen based at least in part on the acquired signals and store the determined parameters of interest 122 in a memory (e.g., memory 190). In some embodiments, computing system 130 is configured as a process control metrology engine to directly estimate values of one or more parameters of interest based on scatterometry measurements of wafers under process using a measurement model.

In another aspect, metrology based on T-SAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

Figure 6:
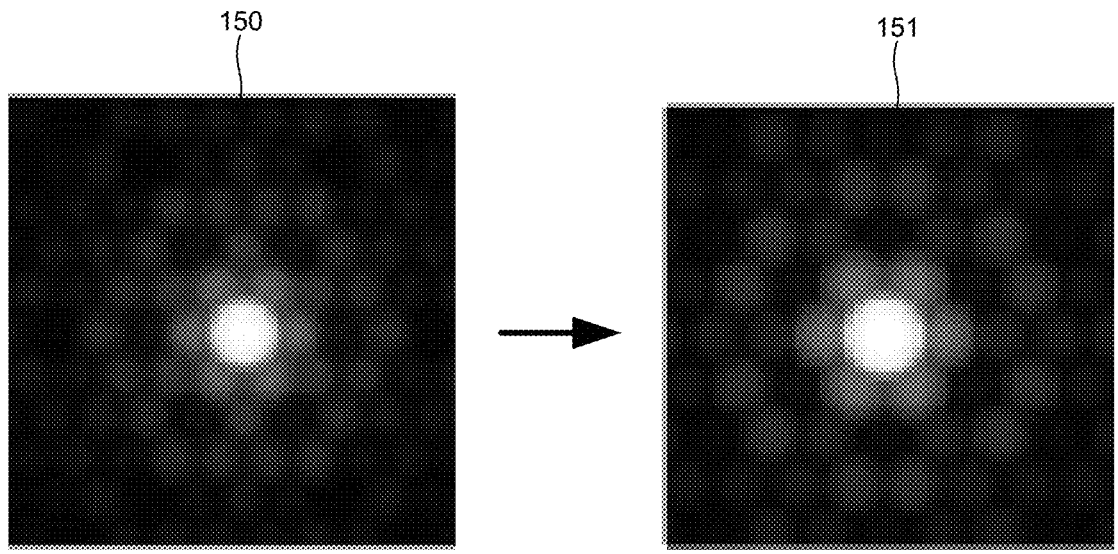
FIG. 6 depicts scattering images illustrative of changes of size of an etched hole.
Figure 7:
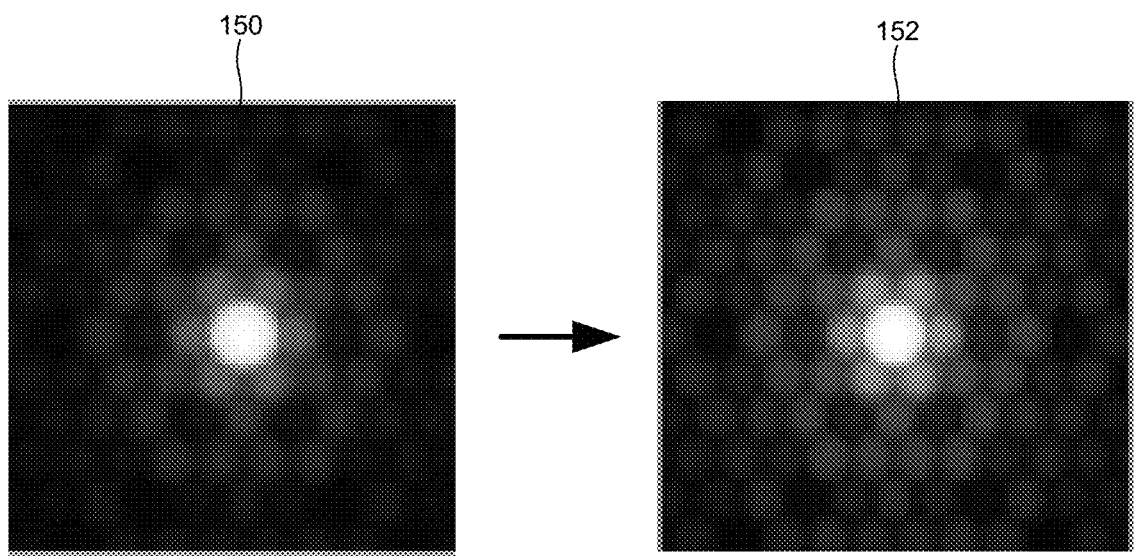
FIG. 7 depicts scattering images illustrative of changes of the depth of an etched hole.

In some embodiments, the measurement model is an electromagnetic model (e.g., a Born Wave Model) of the measurement that generates images representative of the scattering from the target under measurement. For example, images 150-152 depicted in FIGS. 6 and 7 are images representative of scattering from a target under measurement. The modelled images may be parameterized by process control parameters (e.g., etch time, etch tilt, etch selectivity, deposition rate, etc.). The modelled images may also be parameterized by structural parameters of the measured high aspect ratio structure (e.g., height, diameter at different heights, alignment of a hole with respect to other structures, the straightness of a hole feature, the concentricity of a hole feature, thickness of deposited layers as a function of depth, uniformity of deposited layers across a particular hole feature or between different hole features, etc.).

The measured scattering images are employed to monitor a fabrication process by performing an inverse solve to estimate values of one or more of the parameters of interest. In these examples, an inverse solve would solve for values of process parameters, geometric parameters, or both, that generate modelled scattering images that most closely match measured images. In some examples, the space of scattering images is searched using the measurement model using regression methods (e.g., gradient descent, etc.). In some examples, a library of precomputed images is generated and the library is searched to find values of one or more of the parameters of interest that result in the best match between modelled and measured images.

In some other examples, a measurement model is trained by a machine learning algorithm to relate many samples of scattering images and known process conditions, geometric parameter values, or both. In this manner, the trained measurement model maps measured scattering images to estimated values of process parameters, geometric parameters, or both. In some examples, the trained measurement model is a signal response metrology (SRM) model that defines a direct, functional relationship between actual measurements and parameters of interest.

In general, any of the trained models described herein is implemented as a neural network model. In other examples, any of the trained models may be implemented as a linear model, a non-linear model, a polynomial model, a response surface model, a support vector machines model, a decision tree model, a random forest model, a deep network model, a convolutional network model, or other types of models.

In some examples, any of the trained models described herein may be implemented as a combination of models. Additional description of model training and the use of trained measurement models for semiconductor measurements is provided in U.S. Patent Publication No. 2016/0109230 by Pandev et al., the content of which is incorporated herein by reference in its entirety.

In some other examples, a free-form model that does not include a preconceived geometry and material distribution describes the geometry and material parameters of the structure under measurement. In some examples, the model includes many small voxels (volumetric elements) that each have an independently adjustable material parameter value (e.g., electron density, absorptivity, or complex refractive index). In some other embodiments, the material properties are piecewise constant. The properties associated with each different material are determined a priori. The boundaries between different materials are free-form surfaces, and these surfaces can be determined by the level set algorithm.

The measured scatterometry data is used to calculate an image of the sample. In some examples, the image is a two dimensional (2-D) map of electron density, absorptivity, complex index of refraction, or a combination of these material characteristics. In some examples, the image is a three dimensional (3-D) map of electron density, absorptivity, complex index of refraction, or a combination of these material characteristics. The map is generated using relatively few physical constraints. These techniques are described in further detail in U.S. Patent Publication No. 2015/0300965 by Sezginer et al., the subject matter of which is incorporated herein by reference in its entirety.

It is desirable to perform measurements at large ranges of angle of incidence and azimuth angle to increase the precision and accuracy of measured parameter values. This approach reduces correlations among parameters by extending the number and diversity of data sets available for analysis to include a variety of large-angle, out of plane orientations. For example, in a normal orientation, T-SAXS is able to resolve the critical dimension of a feature, but is largely insensitive to sidewall angle and height of a feature. However, by collecting measurement data over a broad range of out of plane angular orientations, the sidewall angle and height of a feature can be resolved. In other examples, measurements performed at large ranges of angle of incidence and azimuth angle provide sufficient resolution and depth of penetration to characterize high aspect ratio structures through their entire depth.

Measurements of the intensity of diffracted radiation as a function of x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

Figure 2:
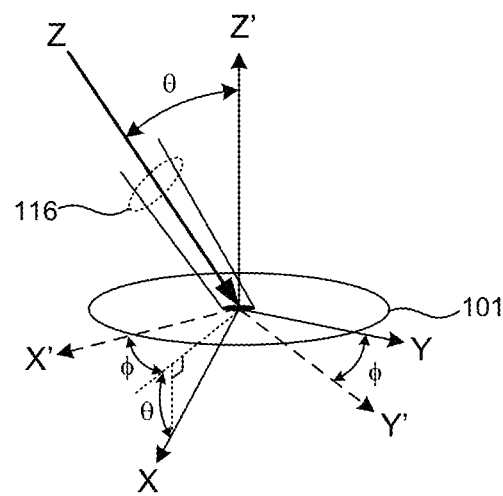
FIG. 2 is a diagram illustrative of an x-ray illumination beam incident on a wafer at a particular orientation described by an angle of incidence, θ, and an azimuth angle, φ.

Each orientation of the illuminating x-ray beam 116 relative to the surface normal of a semiconductor wafer 101 is described by any two angular rotations of wafer 101 with respect to the x-ray illumination beam 115, or vice-versa. In one example, the orientation can be described with respect to a coordinate system fixed to the wafer. FIG. 2 depicts x-ray illumination beam 116 incident on wafer 101 at a particular orientation described by an angle of incidence, $\theta$, and an azimuth angle, $\phi$. Coordinate frame XYZ is fixed to the metrology system (e.g., illumination beam 116) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 2, x-ray illumination beam 116 is aligned with the Z-axis and thus lies within the XZ plane. Angle of incidence, $\theta$, describes the orientation of the x-ray illumination beam 116 with respect to the surface normal of the wafer in the XZ plane. Furthermore, azimuth angle, $\phi$, describes the orientation of the XZ plane with respect to the X'Z' plane. Together, $\theta$ and $\phi$, uniquely define the orientation of the x-ray illumination beam 116 with respect to the surface of wafer 101. In this example, the orientation of the x-ray illumination beam with respect to the surface of wafer 101 is described by a rotation about an axis normal to the surface of wafer 101 (i.e., Z' axis) and a rotation about an axis aligned with the surface of wafer 101 (i.e., Y axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis.

In one aspect, wafer processing system 100 includes a specimen positioning system 140 configured to actively position specimen 101 in six degrees of freedom with respect to illumination beam 116. In addition, specimen positioning system 101 is configured to align specimen 101 and orient specimen 101 over a large range of angles of incidence (e.g., at least 70 degrees) and azimuth angle (e.g., at least 190 degrees) with respect the illumination beam 116. In some embodiments, specimen positioning system 140 is configured to rotate specimen 101 over a large range of angles of rotation (e.g., at least 70 degrees) aligned in-plane with the surface of specimen 101. In this manner, angle resolved measurements of specimen 101 are collected by the x-ray scatterometer over any number of locations and orientations on the surface of specimen 101. In one example, computing system 130 communicates command signals 139 to specimen positioning system 140 that indicate the desired position of specimen 101. In response, specimen positioning system 140 generates command signals to the various actuators of specimen positioning system 140 to achieve the desired positioning of specimen 101.

In some other embodiments, the x-ray scatterometer system is configured to rotate with respect to the wafer under measurement. In these embodiments, the wafer is moved in the XY plane, and the optical elements of the x-ray scatterometer are rotated about the point of incidence of the illumination beam 116 on wafer 101.

Figure 8:
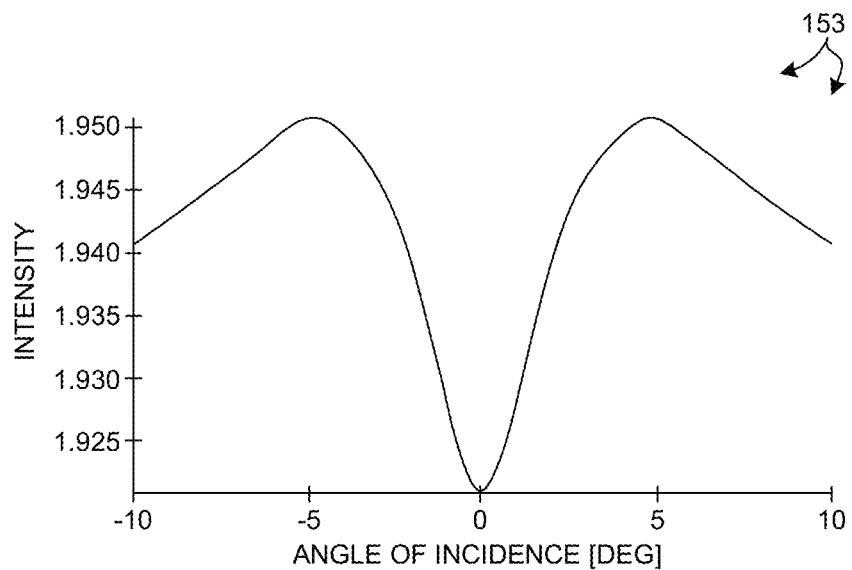
FIG. 8 depicts a plot of the scattering efficiency of the zero order beam, $S_{00}$, as a function of angle of incidence, θ.

The scattering efficiency of the measured specimen relates the extracted scattering intensities to the geometry and materials of the metrology target for a set of incidence angles $\{\theta,\phi\}$. FIG. 8 depicts a plot 153 of the scattering efficiency of the zero order beam, $S_{00}$, as a function of angle of incidence, $\theta$. $S_{00}$ depends on the incidence angle because transmission through the target decreases at higher incidence angles due to increased path length. In addition, $S_{00}$ depends on the incidence angle because energy leaves the zero order and enters the higher diffracting orders when the incidence angle is aligned with the scattering of the target (e.g., normal incidence).

Figure 9:
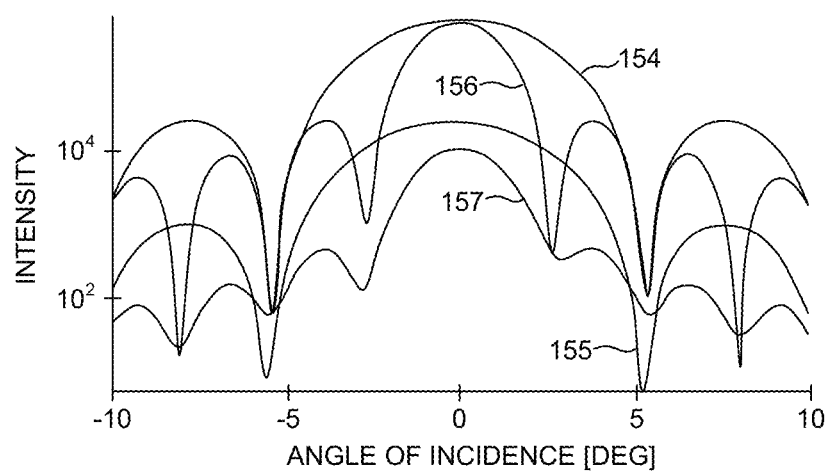
FIG. 9 depicts the scattering efficiency of several higher orders as a function of angle of incidence, θ.

FIG. 9 depicts the scattering efficiency of several higher orders as a function of angle of incidence, $\theta$. Plotline 154 depicts $S_{11}$, plotline 155 depicts $S_{13}$. plotline 156 depicts $S_{20}$, and plotline 157 depicts $S_{22}$. The scattering intensity for all higher orders typically depends on the scattering depth or density. In general, the scattering amplitude of the zero order decreases as scattering depth increases, while the scattering amplitude of every other scattered order increases as scattering depth increases.

In another aspect, process corrections are determined based on the measured values of the parameters of interest (e.g., critical dimension, overlay, height, sidewall angle, etc.) and the corrections are communicated to the process tool to change one or more process control parameters of the process tool (e.g., lithography tool, etch tool, deposition tool, etc.). In some embodiments, SAXS measurements are performed and process control parameters are updated while the process is being executed on the measured structure. In some embodiments, SAXS measurements are performed after a particular process step and process control parameters associated with that process step are updated for processing of future devices by that process step. In some embodiments, SAXS measurements are performed after a particular process step and process control parameters associated with a subsequent process step are updated for processing of the measured device or other devices by the subsequent process step.

In some examples, values of measured parameters determined based on measurement methods described herein can be communicated to an etch tool to adjust the etch time to achieve a desired etch depth. In a similar way etch parameters (e.g., etch time, diffusivity, etc.) or deposition parameters (e.g., time, concentration, etc.) may be included in a measurement model to provide active feedback to etch tools or deposition tools, respectively. In some examples, corrections to process parameters determined based on measured device parameter values may be communicated to the process tool. In one embodiment, computing system 130 determines values of one or more parameters of interest during process based on measured signals 135 received from metrology system 101. In addition, computing system 130 communicates control commands 136 to process controller 109 based on the determined values of the one or more parameters of interest. The control commands 136 cause the process controller 109 to change the state of the process (e.g., stop the etch process, change the diffusivity, etc.). In one example, control command 136 causes process controller 109 to stop the etch process when a desired etch depth is measured. In another example, control command 136 causes process controller 109 to change etch rate to improve measured wafer uniformity of a CD parameter.

In general, as incident x-ray illumination interacts with periodic features, the x-ray illumination scatters coherently to create a diffraction image on detector 119 (e.g., images 150-152 depicted in FIGS. 6-7). The desired scattered image or sequence of scattered images is achieved when the process tool is properly tuned. However, as the measured images deviate from the desired image or sequence of desired images, these deviations indicate process tool drift and also the corrections to process control variables required to bring the process tool back into proper tune.

Figure 3:
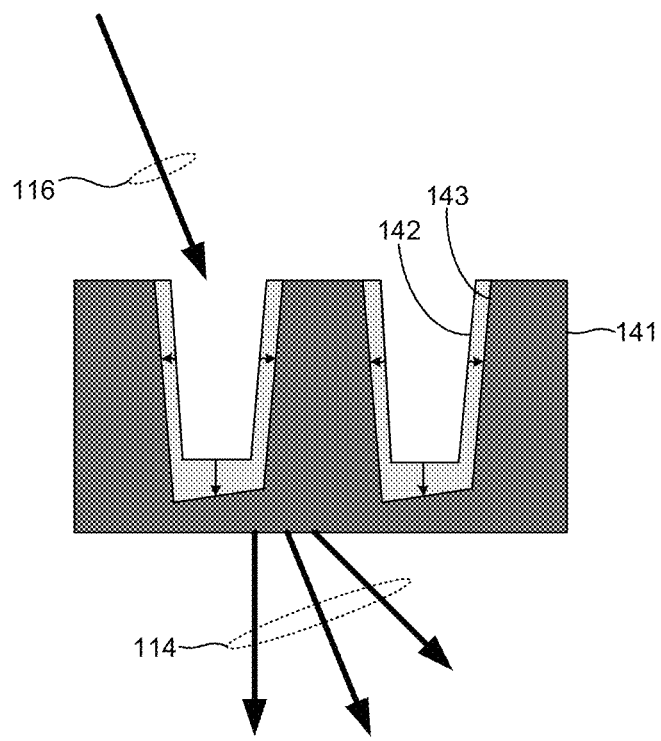
FIG. 3 is a diagram illustrative of a semiconductor structure including two hole features undergoing an etch process in one embodiment.

FIG. 3 is a diagram illustrative of a semiconductor structure 141 including two hole features undergoing an etch process. As depicted in FIG. 3, the initial profile 142 of the hole is changed to an enlarged profile 143 by the etch process. As depicted in FIG. 3, x-ray illumination 116 is directed to structure 141 at the target of interest. This location of incidence is selected to best represent the aspects of the process critical to device yield. As the etch process progresses, the depth of the hole features and the width of the hole features change.

Figure 4:
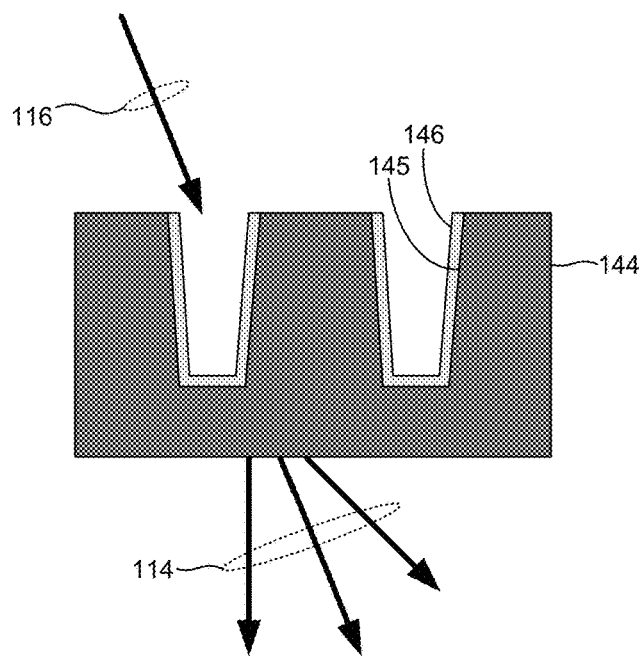
FIG. 4 is a diagram illustrative of a semiconductor structure including two hole features undergoing a deposition process in another embodiment.

FIG. 4 is a diagram illustrative of a semiconductor structure 144 including two hole features undergoing a deposition process. As depicted in FIG. 4, the initial profile 145 of the hole is changed to a reduced profile 145 by the deposition process. As depicted in FIG. 4, x-ray illumination 116 is directed to structure 144 at the target of interest. This location of incidence is selected to best represent the aspects of the process critical to device yield. As the deposition process progresses, the depth of the hole features and the width of the hole features change.

FIG. 6 depicts scattering images 150 and 151 illustrative of changes of the size of an etched hole. As the etched hole feature changes size during the etch process, the spatial Fourier transform of the etched feature changes causing a change in the diffraction pattern. As the intensity pattern across the orders shrinks, it indicates that the feature size is increasing (e.g., the diameter of a hole feature is increasing). To avoid an unwanted increase in hole diameter, a process control parameter (e.g., etch time) is adjusted to prevent unwanted increase in hole diameter.

FIG. 7 depicts scattering images 150 and 152 illustrative of changes of the depth of an etched hole. As the etched hole deepens during an etch process or becomes more shallow during a deposition process, the spatial Fourier transform of the etched feature changes causing a change in the intensity of the detected diffraction pattern. As the intensity across the orders increases, it indicates that the hole depth is increasing, or vice versa, as the intensity across the orders decreases, it indicates that the hole depth is decreasing. To avoid an unwanted change in hole depth, a process control parameter (e.g., etch time, bias voltage, etc.) is adjusted to prevent unwanted change in hole depth.

Figure 5:
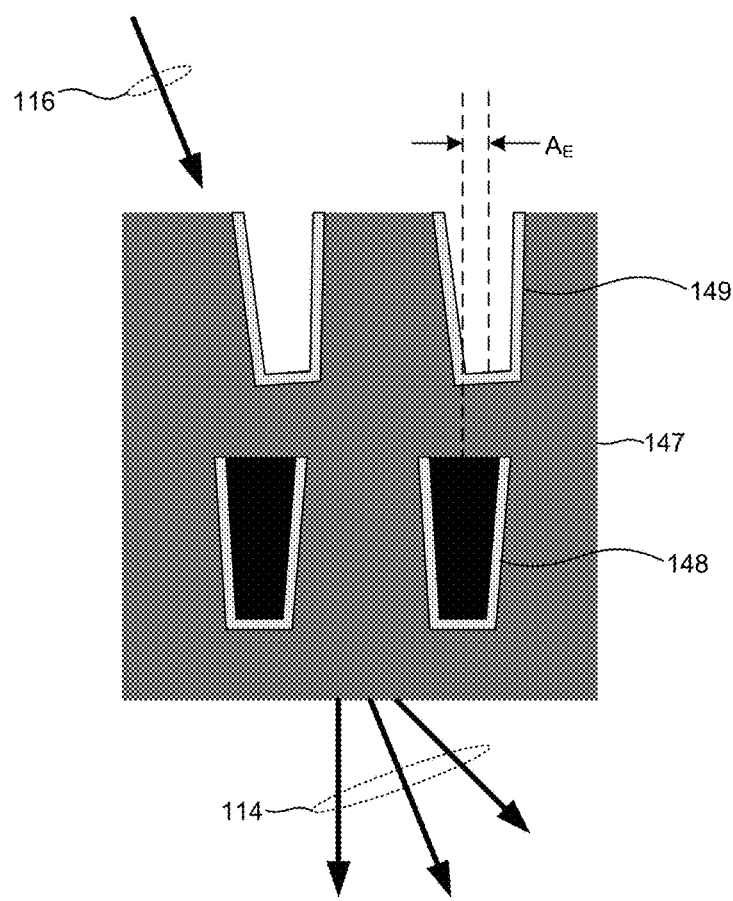
FIG. 5 is a diagram illustrative of a semiconductor structure including two layers, each including two hole features.

FIG. 5 is a diagram illustrative of a semiconductor structure 147 including two layers, each including two hole features. The first layer includes a filled hole 148. The second layer includes an unfilled hole 149. As depicted in FIG. 5, hole 149 of the second layer is tilted and offset by alignment error distance, $A_E$, with respect to filled hole 148 of the first layer. As depicted in FIG. 5, x-ray illumination 116 is directed to structure 147 at the target of interest. This location of incidence is selected to best represent the aspects of the process critical to device yield.

The phase of the detected scattering from the lower structure (i.e., hole 148) with respect to the processed structure (i.e., hole 149) provides an indication of the alignment error distance, $A_E$. Scattering from the processed structure with respect to the incidence angle of the x-ray illumination 116 provides an indication of the tilt of hole 149. Together, these measured signals enable the estimation of overlay error and tilt. In turn, edge placement errors are corrected by correcting process control parameters of an etch tool to correct tilt and correcting process control parameters of a lithography tool to correct overlay error. Additional description of monitoring of overlay and hole tilt is provided in U.S. Patent Application No. 2015/0117610, the subject matter of which is incorporated herein by reference it its entirety.

In general, a metrology target is characterized by an aspect ratio defined as a maximum height dimension (i.e., dimension normal to the wafer surface) divided by a maximum lateral extent dimension (i.e., dimension aligned with the wafer surface) of the metrology target. In some embodiments, the metrology target under measurement has an aspect ratio of at least twenty. In some embodiments, the metrology target has an aspect ratio of at least forty.

Figure 12A:
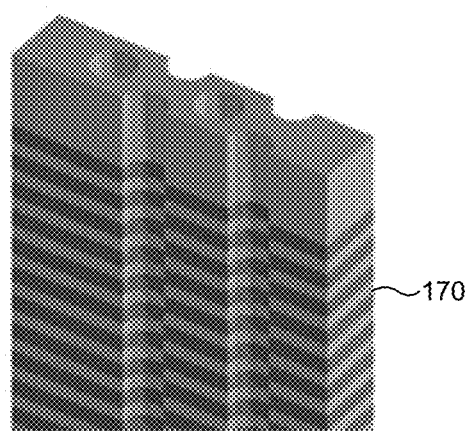
FIGS. 12A-12C depict an isometric view, a top view, and a cross-sectional view, respectively, of a typical 3D FLASH memory device subject to measurement as described herein.
Figure 12B:
Figure 12C:
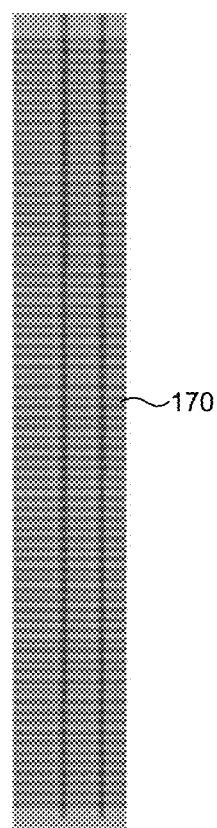

FIGS. 12A-12C depict an isometric view, a top view, and a cross-sectional view, respectively, of a typical 3D FLASH memory device 170 subject to measurement in the manner described herein. The total height (or equivalently depth) of memory device 170 ranges from one to several micrometers. Memory device 170 is a vertically manufactured device. A vertically manufactured device, such as memory device 170, essentially turns a conventional, planar memory device 90 degrees, orienting the bit line and cell string vertically (perpendicular to wafer surface). To provide sufficient memory capacity, a large number of alternating layers of different materials are deposited on the wafer. This requires patterning processes to perform well to depths of several microns for structures with a maximum lateral extent of one hundred nanometers or less. As a result, aspect ratios of 25 to 1 or 50 to 1 are not uncommon.

Figure 10:
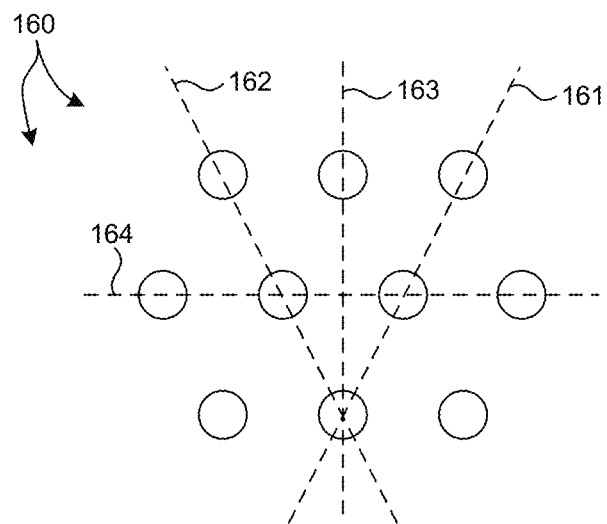
FIG. 10 depicts a top view of an array of high aspect ratio hole structures.

FIG. 10 depicts a top view of an array of high aspect ratio hole structures 160. As depicted in FIG. 10, the array of hole structures is most closely patterned along planes 161, 162, 163, and 164 (which extend inward and outward from the drawing). In some embodiments, it is preferred to perform measurements of high aspect ratio structures as described herein at orientations of the incident x-ray illumination beam with respect to the surface of the wafer under measurement that lie within planes where an array of high aspect ratio structures is most closely patterned. In the example depicted in FIG. 10, it is preferred to provide x-ray illumination to the array of hole structures 160 within planes 161, 162, 163, and 164, where the array of hole structures is most closely patterned.

Figures 11A, 11B, 11C:
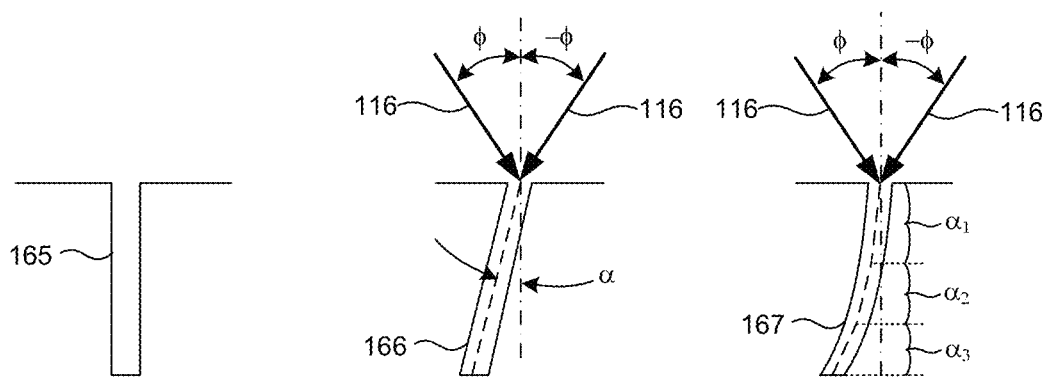
FIG. 11A is a diagram illustrative of a side view of an ideal high aspect ratio hole structure.
FIG. 11B is a diagram illustrative of a side view of a tilted hole structure.
FIG. 11C is a diagram illustrative of a side view of a progressively tilted hole structure.

FIG. 11A depicts a side view of an ideal high aspect ratio hole structure 165. FIG. 11B depicts a side view of a tilted hole structure 166. FIG. 11C depicts a side view of a progressively tilted hole structure 167, where the degree of tilt progressively increases with depth. In many examples, hole structures 166 and 167 are undesirable. In some embodiments, hole structures resembling hole structures 166 and 167 are characterized by T-SAXS measurements as described herein. In one example, hole structure 166 is characterized by a tilt angle parameter, $\alpha$. Furthermore, x-ray illumination beam 116 is provided to hole structure 166 at an angle, $\phi$, with respect to the surface normal, and at the opposite angle, $-\phi$, as described, for example, with reference to FIG. 2. In some embodiments, differences in measured T-SAX signals that arise in these two illumination scenarios provide sufficient signal information to accurately estimate the tilt angle, $\alpha$.

In another example, hole structure 167 is piecewise characterized by a number of tilt angle parameter, $\alpha_1$, $\alpha_2$, and $\alpha_3$. Similarly, x-ray illumination beam 116 is provided to hole structure 167 at an angle, $\phi$, with respect to the surface normal, and at the opposite angle, $-\phi$, as described, for example, with reference to FIG. 2. In some embodiments, differences in measured T-SAX signals that arise in these two illumination scenarios provide sufficient signal information to accurately estimate the tilt angles, $\alpha_1$, $\alpha_2$, and $\alpha_3$.

In the embodiment depicted in FIG. 1, the T-SAXS metrology system is integrated with the process tool, and provides measurement results to the process tool while the process is undertaken. However, in general, the T-SAXS metrology system may be implemented as a standalone tool. In these embodiments, the process step must be completed and wafer 101 transferred to the standalone T-SAXS tool for measurement. Changes to process control variables are communicated to the process tool for processing of subsequent wafers.

The measurement frequency of a particular high aspect ratio structure under fabrication depends on the stability of the monitored process parameter. Moreover, the length of measurement time required depends on the scattering sensitivity to changes in the monitored process variable. Measuring a scattering signal in-situ provides the fastest measurement of process conditions but with the highest degree of uncertainty. Whereas, longer measurement times provide greater precision and certainty of the measured parameters. In general, process parameters that affect the entire scattering volume (e.g., etch time) can be monitored the fastest, while other parameters (e.g., minor deviations of the etch profile) require either a moving average or longer measurement time to achieve meaningful results. Thus, these parameters can only be controlled on a slower basis. The tradeoff between sensitivity and required measurement time exists whether the measurements are performed in-situ or on a standalone tool. However, longer measurements are typically more accurately performed in a more stable, standalone tool designed for that particular measurement.

Although, FIG. 1 depicts a transmission SAXS measurement system, in general, a reflective SAXS measurement system may be employed to measure shallow features.

Figure 13:
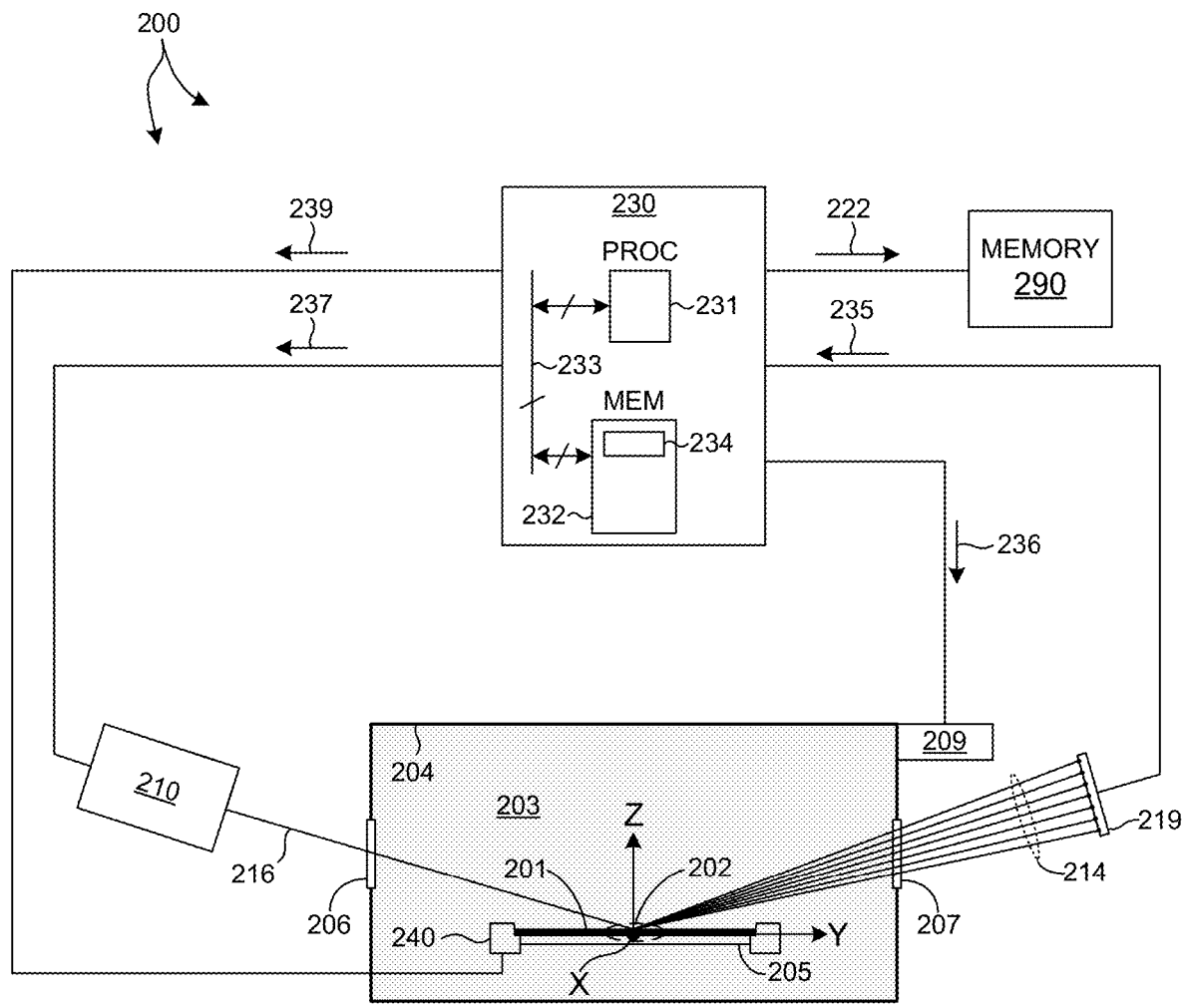
FIG. 13 depicts an exemplary wafer processing system 200 for monitoring of an etch process based on reflective x-ray scatterometry measurements of semiconductor structures disposed on a wafer under process.

FIG. 13 depicts an exemplary wafer processing system 200 for monitoring of an etch process based on x-ray scatterometry measurements of semiconductor structures disposed on a wafer under process. In one aspect, a reflective scatterometry metrology system is integrated with an etch process tool. The measured values of the parameters of interest are provided as feedback to control the etch process tool.

Wafer processing system 200 includes a process chamber 204 containing a process environment 203 and a reflective x-ray scatterometer. Semiconductor wafer 201 is located within process chamber 204. Wafer 201 is attached to wafer chuck 205 and is positioned with respect to process chamber 204 and the x-ray scatterometer by wafer stage 240.

In one embodiment, process chamber 204 is an element of a reactive ion etch system. In this embodiment, process environment 203 includes a radio frequency induced plasma that etches away exposed material on the surface of wafer 201.

In the depicted embodiment, the SAXS metrology system includes an x-ray illumination source 210 configured to generate x-ray radiation suitable for reflective SAXS measurements analogous to the description of illumination source 110 with reference to FIG. 1.

In some examples, computing system 130 communicates command signals 237 to x-ray illumination source 210 that cause x-ray illumination source 210 to emit x-ray radiation at a desired energy level. The energy level is changed to acquire measurement data with more information about the high aspect ratio structures under measurement.

The illumination beam 216 passes through window 206 of process chamber 204 and illuminations specimen 201 over a measurement spot 201. After incidence with wafer 201, scattered x-ray radiation 214 exits process chamber 204 through window 207. In some embodiments, the optical path length between process chamber 204 and detector 219 (i.e., the collection beam path) is long and x-ray scattering in air contributes noise to the image on the detector. Hence, in preferred embodiments, a significant portion of the collection beam path length between process chamber 204 and detector 219 is maintained in a localized vacuum environment.

X-ray detector 219 collects x-ray radiation 214 scattered from specimen 201 and generates an output signals 235 indicative of properties of specimen 201 that are sensitive to the incident x-ray radiation in accordance with a reflective SAXS measurement modality. In some embodiments, scattered x-rays 214 are collected by x-ray detector 219 while specimen positioning system 240 locates and orients specimen 201 to produce angularly resolved scattered x-rays in accordance with command signals 239 communicated from computing system 230 to specimen positioning system 240.

In a further aspect, computing system 230 is employed to determine properties of wafer 201 (e.g., structural parameter values) based on one or more diffraction orders of scattered light. As depicted in FIG. 13, system 200 includes a computing system 230 employed to acquire signals 235 generated by detector 219 and determine properties of the specimen based at least in part on the acquired signals, and store an indication 222 of the determined values of the parameters of interest in a memory (e.g., memory 290). In some embodiments, computing system 230 is configured as a process control metrology engine to directly estimate values of one or more parameters of interest based on scatterometry measurements of wafers under process using a measurement model.

In addition, computing system 130 communicates control commands 236 to process controller 209 based on the determined values of the one or more parameters of interest. The control commands 236 cause the process controller 209 to change the state of the process (e.g., stop the etch process, change the diffusivity, etc.).

Figure 14:
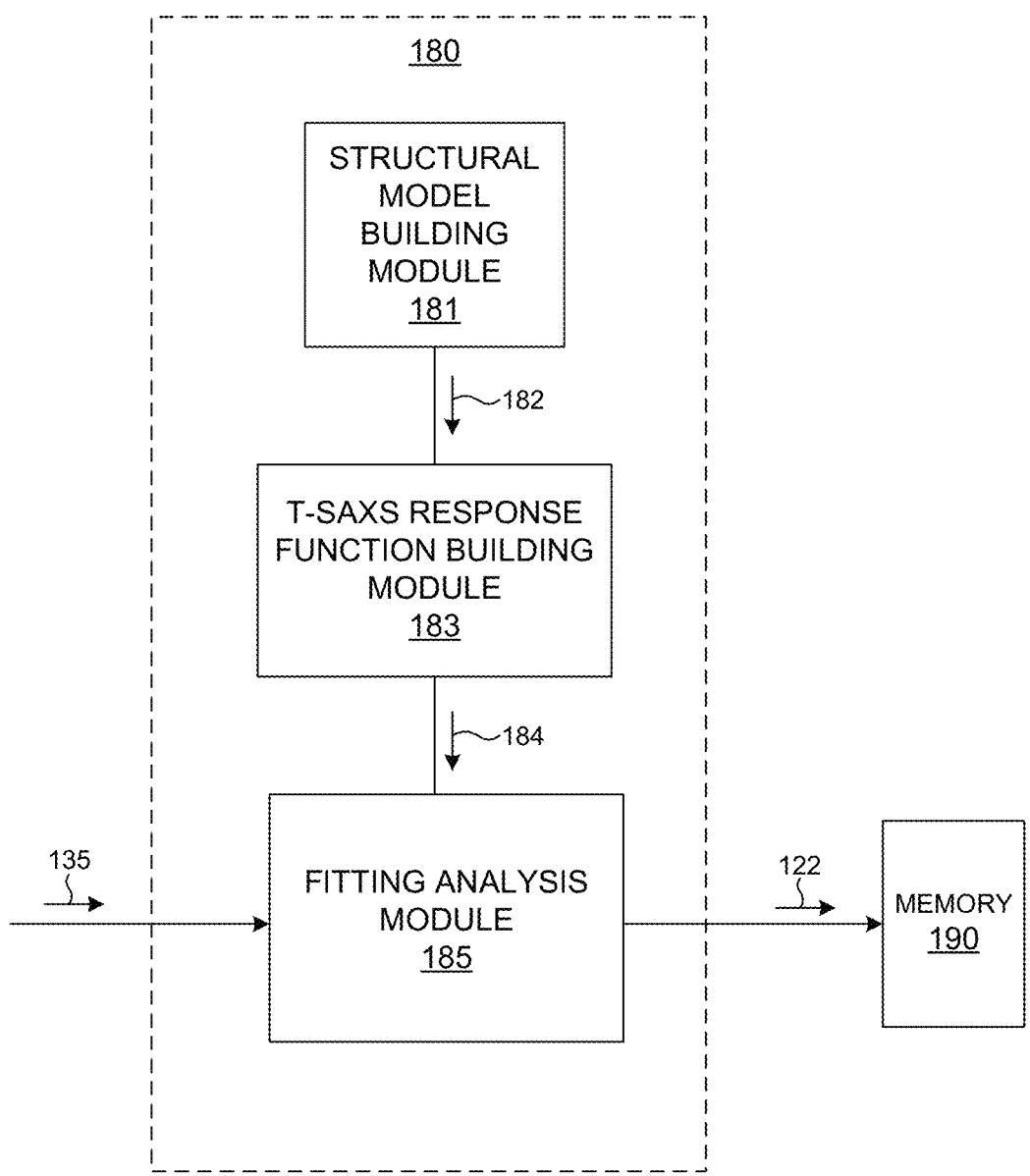
FIG. 14 is a diagram illustrative of an exemplary model building and analysis engine 180.

FIG. 14 is a diagram illustrative of an exemplary model building and analysis engine 180 implemented by computing system 130. As depicted in FIG. 14, model building and analysis engine 180 includes a structural model building module 181 that generates a structural model 182 of a measured structure of a specimen. In some embodiments, structural model 182 also includes material properties of the specimen. The structural model 182 is received as input to T-SAXS response function building module 183. T-SAXS response function building module 183 generates a T-SAXS response function model 184 based at least in part on the structural model 182. In some examples, the T-SAXS response function model 183 is based on x-ray form factors, $$F(\vec{q}) = \int \rho(\vec{r}) e^{-i\vec{q}\cdot\vec{r}} d\vec{r} \qquad (1)$$

where F is the form factor, q is the scattering vector, and ρ(r) is the electron density of the specimen in spherical coordinates. The x-ray scattering intensity is then given by $$I(\vec{q}) = F^*F. \qquad (2)$$

T-SAXS response function model 184 is received as input to fitting analysis module 185. The fitting analysis module 185 compares the modeled T-SAXS response with the corresponding measured data 135 to determine geometric as well as material properties of the specimen.

In some examples, the fitting of modeled data to experimental data is achieved by minimizing a chi-squared value. For example, for T-SAXS measurements, a chi-squared value can be defined as $$\chi^2_{SAXS} = \frac{1}{N_{SAXS}} \sum_j^{N_{SAXS}} \frac{\left(S_j^{SAXS\ model}(v_1, \ldots, v_L) - S_j^{SAXS\ experiment}\right)^2}{\sigma^2_{SAXS,j}} \qquad (3)$$

Where, $S_j^{SAXS\ experiment}$ is the measured T-SAXS signals 126 in the "channel" j, where the index j describes a set of system parameters such as diffraction order, energy, angular coordinate, etc. $S_j^{SAXS\ model}(v_1, \ldots, v_L)$ is the modeled T-SAXS signal $S_j$ for the "channel" j, evaluated for a set of structure (target) parameters where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (3) assumes that the uncertainties associated with different channels are uncorrelated. In examples where the uncertainties associated with the different channels are correlated, a covariance between the uncertainties, can be calculated. In these examples a chi-squared value for T-SAXS measurements can be expressed as $$\chi^2_{SAXS} = \frac{1}{N_{SAXS}} \left(\vec{S}_j^{SAXS\cdot model}(v_1, \ldots, v_M) - \vec{S}_j^{SAXS\cdot experimental}\right)^T \qquad (4)$$

$$V_{SAXS}^{-1}\left(\vec{S}_j^{SAXS\text{-}model}(v_1,\ldots,v_M) - \vec{S}_j^{SAXS\text{-}experimental}\right)$$

where, $V_{SAXS}$ is the covariance matrix of the SAXS channel uncertainties, and T denotes the transpose.

In some examples, fitting analysis module 185 resolves at least one specimen parameter value by performing a fitting analysis on T-SAXS measurement data 135 with the T-SAXS response model 184. In some examples, $\chi_{SAXS}^2$ is optimized.

As described hereinbefore, the fitting of T-SAXS data is achieved by minimization of chi-squared values. However, in general, the fitting of T-SAXS data may be achieved by other functions.

The fitting of T-SAXS metrology data is advantageous for any type of T-SAXS technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing T-SAXS beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 180 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In another aspect, one or more SAXS systems integrated with a process tool are configured to measure multiple, different areas of a wafer during a process interval. In some embodiments, a wafer uniformity value associated with each measured parameter of interest is determined based on measured values of each parameter of interest across the wafer.

In some embodiments, multiple metrology systems are integrated with the process tool and the metrology systems are configured to simultaneously measure different areas across the wafer during process. In some embodiments, a single metrology system integrated with a process tool is configured to sequentially measure multiple, different areas of a wafer during process.

In some embodiments, the methods and systems for SAXS based metrology of semiconductor devices undergoing a process as described herein are applied to the measurement of memory structures. These embodiments enable critical dimension (CD), film, and composition metrology for periodic and planar structures.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, thickness, overlay, and material parameters such as electron density, composition, grain structure, morphology, stress, strain, and elemental identification. In some embodiments, the metrology target is a periodic structure. In some other embodiments, the metrology target is aperiodic.

In some examples, measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM) are performed with T-SAXS measurement systems as described herein.

In some examples, the measurement models are implemented as an element of a SpectraShape® critical-dimension metrology system available from KLA-Tencor Corporation, Milpitas, California, USA. In this manner, the model is created and ready for use immediately after the scattering images are collected by the system.

In some other examples, the measurement models are implemented off-line, for example, by a computing system implementing AcuShape® software available from KLA-Tencor Corporation, Milpitas, California, USA. The resulting models may be incorporated as an element of an AcuShape® library that is accessible by a metrology system performing measurements.

Figure 15:
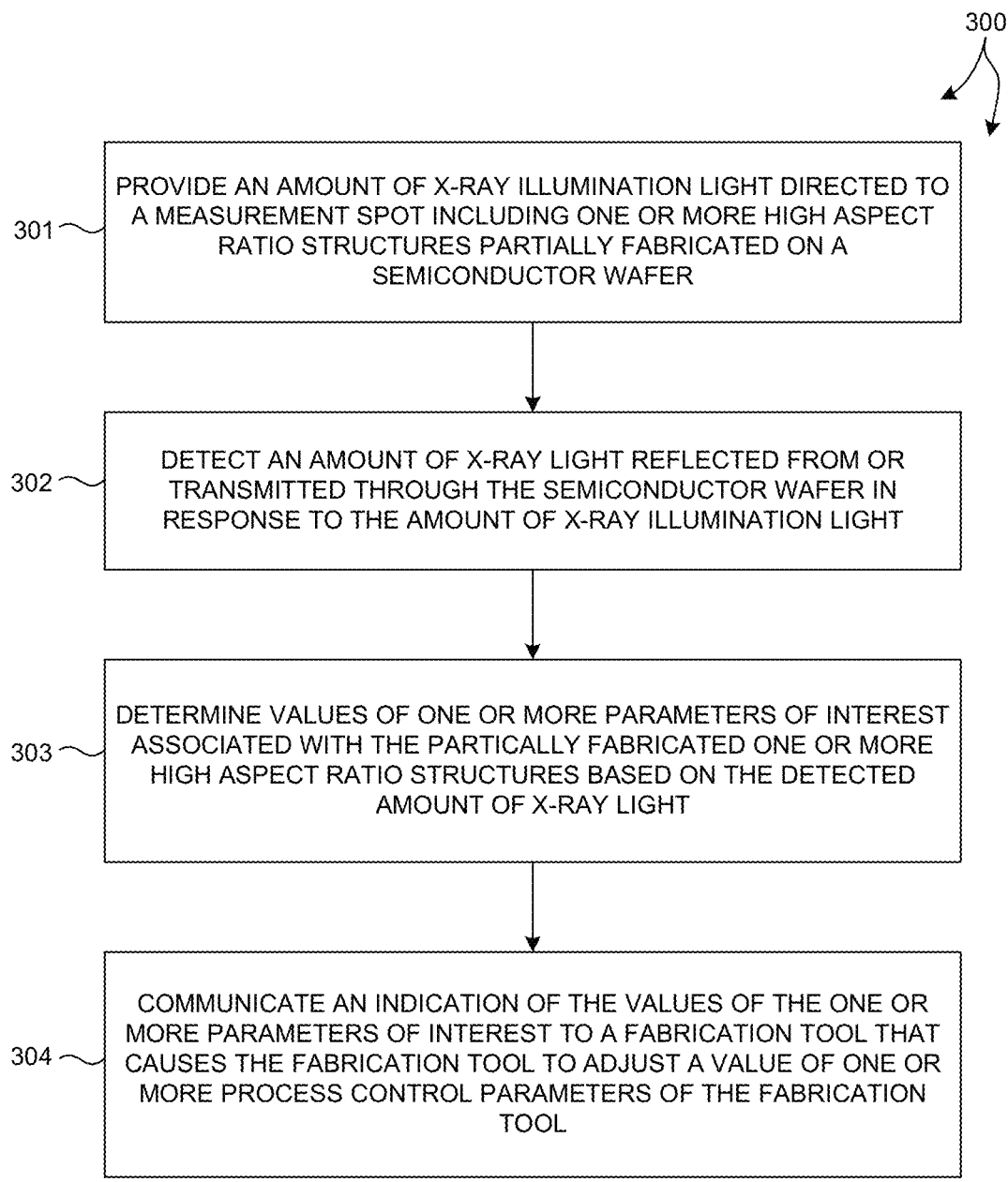
FIG. 15 illustrates a flowchart of a method 300 for controlling a semiconductor fabrication process for high aspect ratio structures based on small angle X-Ray scatterometry measurements.

FIG. 15 illustrates a method 300 of performing metrology measurements during process in at least one novel aspect. Method 300 is suitable for implementation by a metrology system such as the SAXS metrology systems illustrated in FIGS. 1 and 13 of the present invention. In one aspect, it is recognized that data processing blocks of method 300 may be carried out via a pre-programmed algorithm executed by one or more processors of computing system 130, computing system 230, or any other general purpose computing system. It is recognized herein that the particular structural aspects of the metrology systems depicted in FIGS. 1 and 13 do not represent limitations and should be interpreted as illustrative only.

In block 301, an amount of x-ray illumination light is provided to a measurement spot including one or more high aspect ratio structures partially fabricated on a semiconductor wafer.

In block 302, an amount of x-ray light reflected from or transmitted through the semiconductor wafer is detected in response to the amount of x-ray illumination light.

In block 303, values of one or more parameters of interest associated with the partially fabricated one or more high aspect ratio structures are determined based on the detected amount of x-ray light.

In block 304, an indication of the values of the one or more parameters of interest is communicated to a fabrication tool that causes the fabrication tool to adjust a value of one or more process control parameters of the fabrication tool.

In a further embodiment, system 100 includes one or more computing systems 130 employed to perform measurements of semiconductor structures based on scatterometry measurement data collected in accordance with the methods described herein. The one or more computing systems 130 may be communicatively coupled to one or more detectors, active optical elements, process controllers, etc. In one aspect, the one or more computing systems 130 are configured to receive measurement data associated with scatterometry measurements of structures of wafer 101.

It should be recognized that one or more steps described throughout the present disclosure may be carried out by a single computer system 130 or, alternatively, a multiple computer system 130. Moreover, different subsystems of system 100 may include a computer system suitable for carrying out at least a portion of the steps described herein. Therefore, the aforementioned description should not be interpreted as a limitation on the present invention but merely an illustration.

In addition, the computer system 130 may be communicatively coupled to the spectrometers in any manner known in the art. For example, the one or more computing systems 130 may be coupled to computing systems associated with the scatterometers. In another example, the scatterometers may be controlled directly by a single computer system coupled to computer system 130.

The computer system 130 of system 100 may be configured to receive and/or acquire data or information from the subsystems of the system (e.g., scatterometers and the like) by a transmission medium that may include wireline and/or wireless portions. In this manner, the transmission medium may serve as a data link between the computer system 130 and other subsystems of system 100.

Computer system 130 of system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board system 100, external memory, or other external systems). For example, the computing system 130 may be configured to receive measurement data from a storage medium (i.e., memory 132 or an external memory) via a data link. For instance, scattered images obtained using the scatterometers described herein may be stored in a permanent or semi-permanent memory device (e.g., memory 132 or an external memory). In this regard, the scatterometry images may be imported from on-board memory or from an external memory system. Moreover, the computer system 130 may send data to other systems via a transmission medium. For instance, a measurement model or an estimated parameter value determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape. Computing system 230, including elements 231-234, is analogous to computing system 130, including elements 131-134, respectively, as described herein.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
    providing an amount of x-ray illumination light directed to a measurement spot including one or more structures partially fabricated on a semiconductor wafer;
    detecting an amount of x-ray light reflected from or transmitted through the semiconductor wafer in response to the amount of x-ray illumination light;
    determining values of one or more parameters of interest associated with the partially fabricated one or more structures based on the detected amount of x-ray light; and
    communicating an indication of the values of the one or more parameters of interest to a fabrication tool that causes the fabrication tool to adjust a value of one or more process control parameters of the fabrication tool, wherein the one or more structures partially fabricated on the semiconductor wafer are fabricated at least in part by the fabrication tool.

2. The method of claim 1, wherein the amount of x-ray illumination light is provided to the measurement spot and the amount of x-ray light is detected while the fabrication tool is fabricating the one or more structures.

3. The method of claim 1, wherein the adjusting of the value of the one or more process control parameters occurs while the fabrication tool is fabricating the one or more structures.

4. The method of claim 1, further comprising:
    exposing the semiconductor wafer to a fabrication process environment within a fabrication process chamber during a process interval, wherein the amount of x-ray illumination light is provided to the measurement spot and the amount of x-ray light is detected during the process interval.

5. The method of claim 1, wherein the amount of x-ray illumination light is provided to the measurement spot and the amount of x-ray light is detected after the fabrication tool has executed a step of a fabrication process flow on the semiconductor wafer.

6. The method of claim 1, wherein the values of the one or more parameters of interest are determined at a first process step of a fabrication process flow, and wherein the indication of the values of the one or more parameters of interest communicated to the fabrication tool cause the fabrication tool to adjust a value of one or more process control parameters of the fabrication tool at a second process step subsequent to the first process step in the fabrication process flow.

7. The method of claim 1, wherein the values of the one or more parameters of interest are determined at a process step of a fabrication process flow of the one or more structures, and wherein the indication of the values of the one or more parameters of interest communicated to the fabrication tool cause the fabrication tool to adjust a value of one or more process control parameters of the fabrication tool at the process step.

8. The method of claim 1, wherein the fabrication tool is any of an etch process tool, a deposition process tool, and a lithography process tool.

9. The method of claim 1, wherein the amount of x-ray illumination light is directed to the measurement spot at a plurality of angles of incidence, azimuth angles, or both.

10. The method of claim 1, wherein the amount of x-ray illumination light is directed to the measurement spot at a plurality of different energy levels.

11. The method of claim 1, wherein the determining the values of the one or more parameters of interest is based on a model-based measurement model, a trained signal response metrology (SRM) measurement model, or a tomographic measurement model.

12. The method of claim 1, wherein the one or more structures includes a three-dimensional NAND structure or a dynamic random access memory (DRAM) structure.

* * * * *